United States Patent
Mieczkowski et al.

(10) Patent No.: US 10,020,244 B2
(45) Date of Patent: Jul. 10, 2018

(54) POLYMER VIA PLUGS WITH HIGH THERMAL INTEGRITY

(75) Inventors: Van Mieczkowski, Apex, NC (US); Helmut Hagleitner, Zebulon, NC (US); William T. Pulz, Cary, NC (US)

(73) Assignee: Cree, Inc., Durham, NC (US)

( * ) Notice: Subject to any disclaimer, the term of this patent is extended or adjusted under 35 U.S.C. 154(b) by 1161 days.

(21) Appl. No.: 13/431,583

(22) Filed: Mar. 27, 2012

(65) Prior Publication Data
US 2013/0256841 A1  Oct. 3, 2013

(51) Int. Cl.
*H01L 23/48* (2006.01)
*H01L 23/00* (2006.01)

(52) U.S. Cl.
CPC ............ *H01L 23/481* (2013.01); *H01L 24/32* (2013.01); *H01L 24/05* (2013.01); *H01L 24/29* (2013.01); *H01L 2224/04026* (2013.01); *H01L 2224/05644* (2013.01); *H01L 2224/05655* (2013.01); *H01L 2224/05666* (2013.01); *H01L 2224/05669* (2013.01); *H01L 2224/05671* (2013.01); *H01L 2224/05684* (2013.01); *H01L 2224/29144* (2013.01); *H01L 2924/0132* (2013.01); *H01L 2924/1033* (2013.01); *H01L 2924/10158* (2013.01); *H01L 2924/10253* (2013.01); *H01L 2924/10272* (2013.01); *H01L 2924/10329* (2013.01); *H01L 2924/13064* (2013.01)

(58) Field of Classification Search
CPC ................................. H01L 21/76877
USPC ........................................... 257/621
See application file for complete search history.

(56) References Cited

U.S. PATENT DOCUMENTS

| | | | |
|---|---|---|---|
| 4,946,547 A | 8/1990 | Palmour et al. | |
| 5,200,022 A | 4/1993 | Kong et al. | |
| RE34,861 E | 2/1995 | Davis et al. | |
| 5,514,900 A | 5/1996 | Iranmanesh | |
| 5,744,758 A * | 4/1998 | Takenouchi et al. | 174/255 |
| 6,261,500 B1 * | 7/2001 | Park | B29C 70/207 |
| | | | 156/189 |
| 6,627,969 B1 | 9/2003 | Jain et al. | |
| 7,138,714 B2 | 11/2006 | Nguyen et al. | |
| 8,378,462 B2 * | 2/2013 | Matsumoto | 257/621 |
| 2004/0214436 A1 * | 10/2004 | Dow | H01L 21/02063 |
| | | | 438/689 |
| 2006/0065891 A1 | 3/2006 | McCormack et al. | |
| 2008/0277148 A1 * | 11/2008 | Asai et al. | 174/255 |
| 2008/0306554 A1 * | 12/2008 | McKinley | A61B 17/866 |
| | | | 606/301 |
| 2009/0032962 A1 * | 2/2009 | Hougham et al. | 257/773 |
| 2009/0057907 A1 * | 3/2009 | Yang et al. | 257/760 |
| 2009/0104738 A1 * | 4/2009 | Ring et al. | 438/172 |

(Continued)

OTHER PUBLICATIONS

Bolotoff, "Solder Alloys: Physical and Mechanical Properties", http://alasir.com/reference/solder_alloys/, version of Aug. 29, 2011, https://web.archive.org/web/20110829155802/http://alasir.com/reference/solder_alloys/.*

*Primary Examiner* — Peter Bradford
(74) *Attorney, Agent, or Firm* — Myers Bigel, P.A.

(57) ABSTRACT

The present disclosure relates to providing via plugs in vias of a semiconductor material. The via plugs may be formed of a polymer, such as a polyimide, that can withstand subsequent soldering and operating temperatures. The via plugs effectively fill the vias to prevent the vias from being filled substantially with solder during a subsequent soldering processes.

18 Claims, 11 Drawing Sheets

(56) References Cited

U.S. PATENT DOCUMENTS

| | | |
|---|---|---|
| 2011/0027930 A1* | 2/2011 | El-Gamal ........... B81C 1/00301 |
| | | 438/51 |
| 2011/0031626 A1 | 2/2011 | Park |
| 2011/0095361 A1 | 4/2011 | Chang et al. |
| 2011/0095435 A1* | 4/2011 | Volant et al. ................. 257/774 |
| 2011/0121427 A1* | 5/2011 | Stupar ............... H01L 21/76898 |
| | | 257/532 |
| 2011/0169139 A1* | 7/2011 | Lin et al. ...................... 257/621 |
| 2011/0304026 A1* | 12/2011 | Tsui et al. ..................... 257/621 |

* cited by examiner

POLYMER VIA PLUGS WITH HIGH THERMAL INTEGRITY

FIELD OF THE DISCLOSURE

The present disclosure relates to via plugs.

BACKGROUND

Semiconductor devices are generally formed in an epitaxial structure that resides over a semiconductor substrate. During semiconductor fabrication, vias may be formed through the substrate to facilitate electrical connections between portions of a first metallization structure, which resides on one side of the substrate, to portions of a second metallization structure, which resides on the other side of the substrate. Different portions of the different metallization structures may represent contact pads, traces that connect different contact pads, capacitor plates, and the like.

In many instances, the substrates are subsequently soldered to another electronic module to facilitate both an electrical and mechanical connection between the semiconductor devices formed on the substrate and the electronic module. During the solder process, molten solder may wick into and fill the vias. Unfortunately, at soldering and sometimes at normal operating temperatures, the solder may diffuse into and through the first metallization structure, and thus, damage the semiconductor devices or the connections therebetween. Accordingly, there is a need for an effective and efficient way to prevent, or at least significantly reduce, the solder from diffusing in this manner.

SUMMARY

The present disclosure relates to providing via plugs in vias of a semiconductor material, such as a substrate. The via plugs may be formed of a polymer, such as a polyimide, that can withstand subsequent soldering and operating temperatures. The via plugs effectively fill the vias to prevent the vias from being filled substantially with solder during a subsequent soldering processes.

For one embodiment, a semiconductor device is formed on a semiconductor substrate. The semiconductor substrate has a first metallization structure on a first surface and at least one via extending from a second surface of the semiconductor substrate that is opposite the first surface to the first metallization structure. A via plug is provided within the at least one via. The at least one via may have at least one interior wall, and the semiconductor substrate may have a second metallization structure lining at least a portion of the at least one interior wall of the via as well as a portion of the second surface of the semiconductor substrate.

While there are different techniques for forming the via plugs, an exemplary technique follows. First, a semiconductor substrate comprising a first metallization structure on a first surface is provided. Second, at least one via is formed extending from a second surface of the substrate that is opposite the first surface to the first metallization structure. Third, a via plug within the at least one via is formed. The via plug may be formed by first providing a polymer in liquid form over a second surface in a vacuum such that the polymer in liquid form flows into the at least one via and then curing the polymer to form a solidified via plug.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The present disclosure relates to providing via plugs in vias of a semiconductor substrate. The via plugs be formed of a polymer, such as a polyimide, that can withstand subsequent soldering and operating temperatures. The via plugs effectively fill the vias to prevent the vias from being filled substantially with solder during subsequent soldering processes. Prior to delving into the details of the via plugs and processes for providing the via plugs, an overview of a via and a process for generating a via in a semiconductor substrate is provided.

Figure 1:
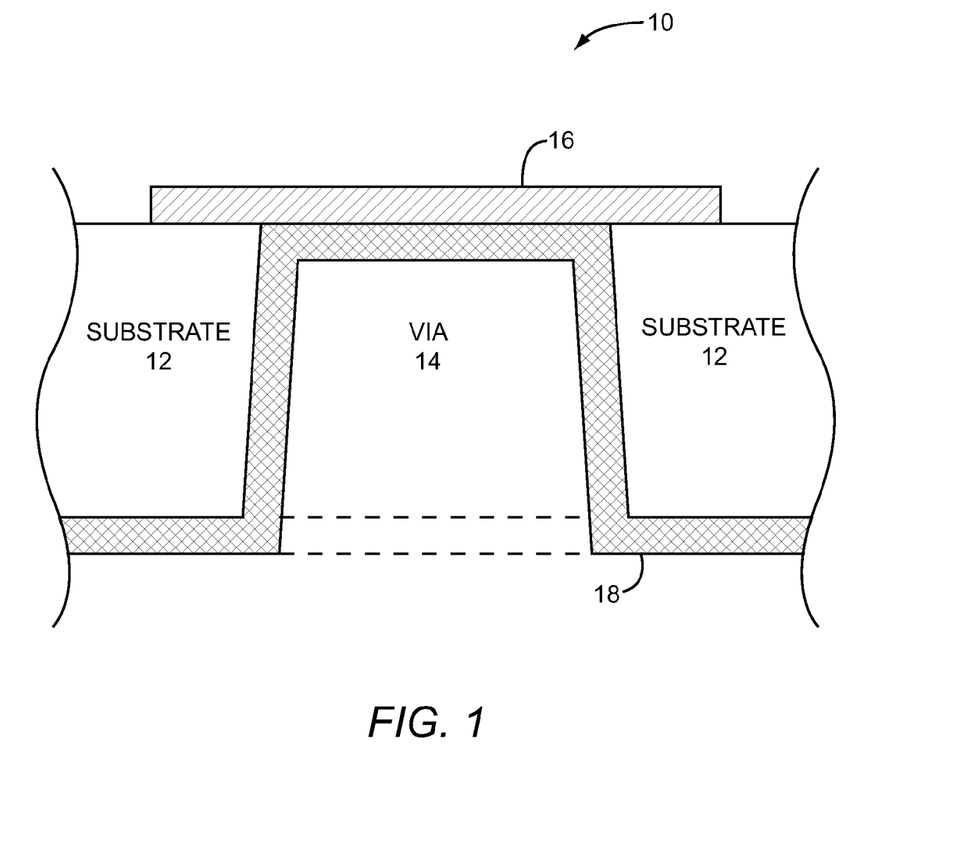
FIG. 1 is a cross-section of a semiconductor substrate including a via.

With reference to FIG. 1, a semiconductor structure 10 is illustrated as having a substrate 12 with a via 14 formed therein. Notably, the via 14 itself extends completely through the substrate 12. The vias 14 may take on various shapes and sizes. For example, the vias may be square, rectangular, circular, and the like. Typical vias 14 may include slot-shaped vias 14 that are 30 microns wide by 100 microns long. Typical round vias 14 may have diameters ranging from around about 20 microns to 100 microns. Those skilled in the art will recognize that the sizes and shapes of the vias 14 may fall within or outside of the stated ranges, as these sizes and ranges are provided merely for exemplary purposes.

As illustrated, a front side metallization structure 16 is shown on the top surface of the substrate 12. The front side metallization structure 16 may represent a contact pad, trace, capacitor plate, inductor coil, ground plane, power plane, or the like that is used in a semiconductor device that is formed on the substrate 12 or used to connect portions of semiconductor devices formed on the substrate 12. A back side metallization structure 18 is shown formed along the bottom surface of the substrate 12 as well as along the interior walls of the via 14 and a portion of the front side metallization structure 16. The substrate 12 may be made of different materials, such as silicon carbide (SiC), gallium nitride (GaN), gallium arsenide (GaAs), silicon (Si), sapphire ($Al_2O_3$), and the like. When silicon carbide is used, the substrate is typically a 4H poly-type of silicon carbine; however, other poly-types including 3C, 6H, and 15R poly-types may be used.

The front side metallization structure 16 may comprise one or more layers formed from low resistive metals, such as gold (Au), copper (Cu), aluminum (Al), and the like. The back side metallization structure 18 may also be formed of one or more low resistive metals, such as titanium (Ti), tungsten (W), nickel (Ni), platinum (Pt), chrome (Cr), gold (Au), and the like.

In one embodiment, the back side metallization structure 18 is formed of at least three layers: a stick layer, a barrier layer, and an outer layer. The stick layer is formed against the substrate 12, the walls of the via 14, and the portion of the front side metallization structure 16 that is exposed by the via 14. The barrier layer is formed over the stick layer, and the outer layer is formed over the barrier layer. The stick layer is effectively a base layer that helps adhere any subsequent layers to the substrate 12 and the exposed portion of the front side metallization structure 16. The stick layer may be generated using a physical vapor deposition (PVD) process, and in this example is formed of titanium at a thickness of between about 800 and 1200 Angstroms. PVD processes may include sputtering or evaporative processes. Other materials for the stick layer may include chromium and palladium. The barrier layer is employed to protect the stick layer from subsequent deposition or soldering processes. In this example, the barrier layer is titanium tungsten (TiW), and has a thickness in the range of 800 to 1200 Angstroms. The barrier layer may include other materials, such as chrome, nickel, platinum, and the like. Like the stick layer, the barrier layer may be formed using a physical vapor deposition process. The outer layer may be created using a plating process, and may be formed of gold, gold-tin, gold-germanium, silver, copper, and the like. The outer layer is generally thicker than the stick layer and barrier layer. For example, the outer layer may be between 1000 and 6000 Angstroms thick. Together, the stick, barrier, and outer layers, along with any other desired layers, may form the back side metallization structure 18. Those skilled in the art will recognize that other compositions may be employed to create the back side metallization structure 18.

Figure 2A:
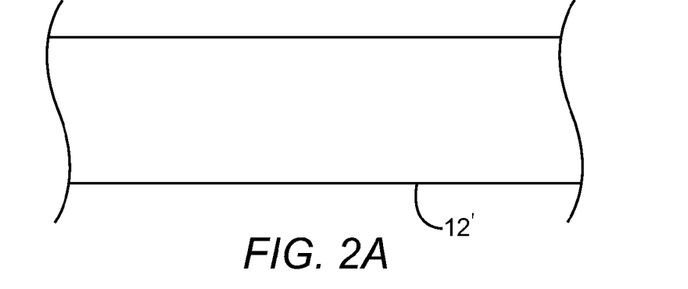
FIGS. 2A-2F graphically illustrate a process for fabricating the substrate and via of FIG. 1.
Figure 2B:
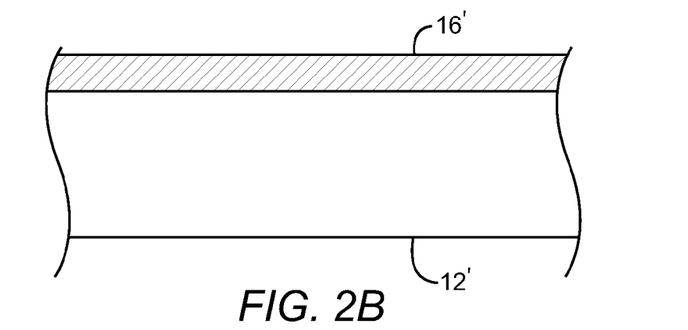
Figure 2C:
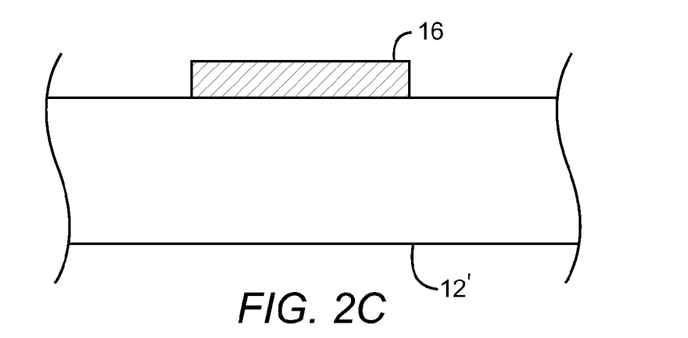
Figure 2D:
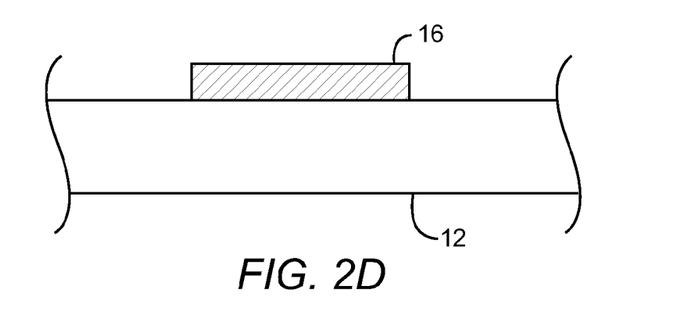

With reference to FIGS. 2A-2F, an exemplary process for forming a substrate 12 that includes a via 14, the front side metallization structure 16, and the back side metallization structure 18 is provided. Initially, a thick substrate 12' is provided (FIG. 2A). A front side metallization layer 16' is then formed over the top surface of the thick substrate 12' (FIG. 2B). Next, the undesired portions of the front side metallization layer 16' are removed such that the front side metallization structure 16 remains, using available etching processes (FIG. 2C). Next, the thick substrate 12' is thinned by employing a mechanical polishing or grinding process to the bottom of the thick substrate 12'. The resultant thinned substrate is referred to generally as the substrate 12 (FIG. 2D).

Figure 2E:
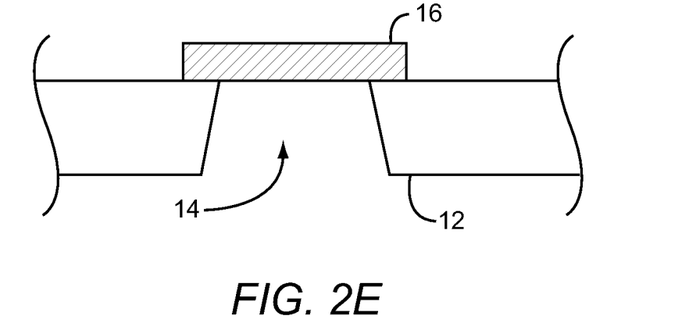
Figure 2F:
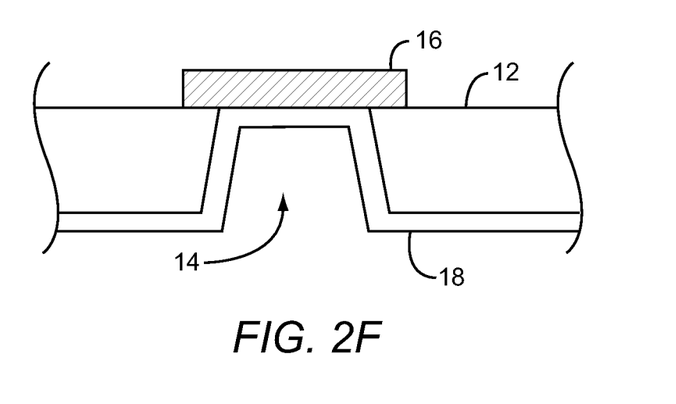

Next, the via 14 is formed from the bottom of the substrate 12, through to the front side metallization structure 16 using an appropriate etching process (FIG. 2E). Finally, the various layers of the back side metallization structure 18 are applied to form the back side metallization structure 18 (FIG. 2F). Notably, the substrate 12 is typically flipped before the thinning, via creation, and back side metallization steps of FIGS. 2D-2F.

Figure 3:
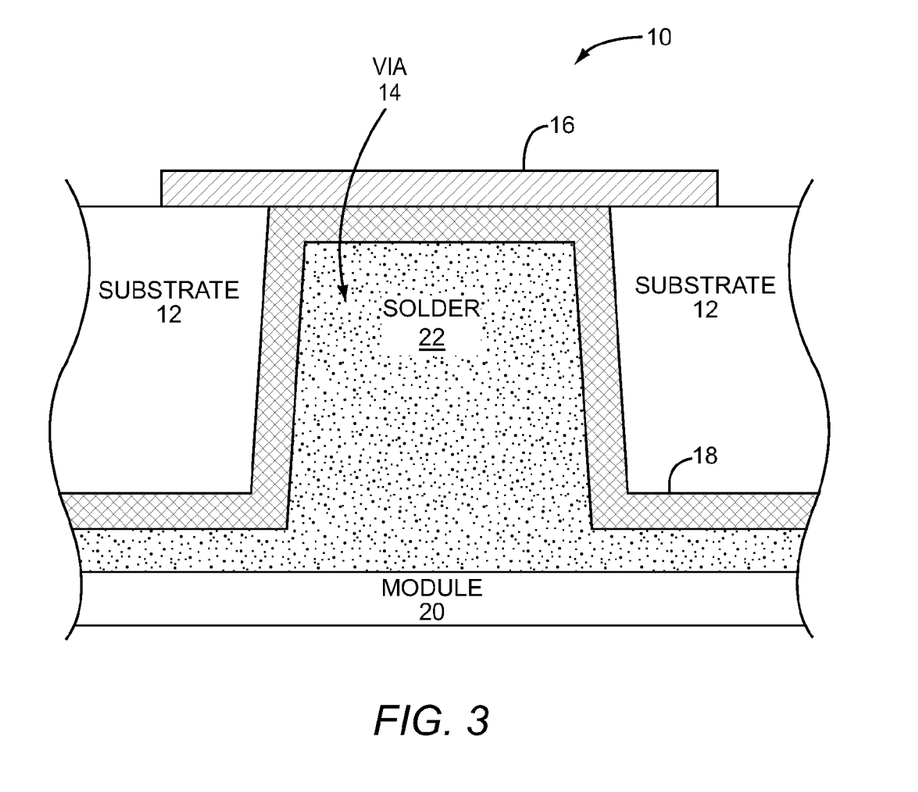
FIG. 3 is a cross-section of the substrate of FIG. 1 coupled to a module, wherein solder fills the via.

With reference to FIG. 3, a semiconductor device that is formed on the substrate 12 may need to be mechanically and electrically coupled to a separate electronic module 20. As illustrated, the substrate 12 is directly soldered to the module 20 with solder 22. In particular, assume the top side of the module 20 includes a metal layer or structure (not shown), and the solder 22 is used to form an electrical and mechanical connection between the back side metallization structure 18 and the module 20. The solder 22 may be a gold-tin (AuSn), gold-germanium, gold-silicon, or other appropriate solder.

During a typical soldering process, the molten solder 22 will flow between the bottom surface of the back side metallization structure 18 and the top surface of the module 20. In addition, the solder 22 may also flow into the vias 14, substantially filling them. Unfortunately, the high temperatures associated with the soldering process and under certain operating conditions cause the solder 22 to diffuse to, into, and sometimes through the front side metallization structure 16. The diffusion of the solder 22 may destroy or degrade the front side metallization structure 16 and any structure connected thereto, including the semiconductor devices that are formed on the substrate 12. For example, if the semiconductor device is a HEMT, vias 14 may be used to interconnect multiple source segments that are interlaced between corresponding gate and drain segments. The solder 22 may diffuse through the vias 14 and short two or more of the source, gate, and drain segments or otherwise degrade the performance thereof.

Figure 4:
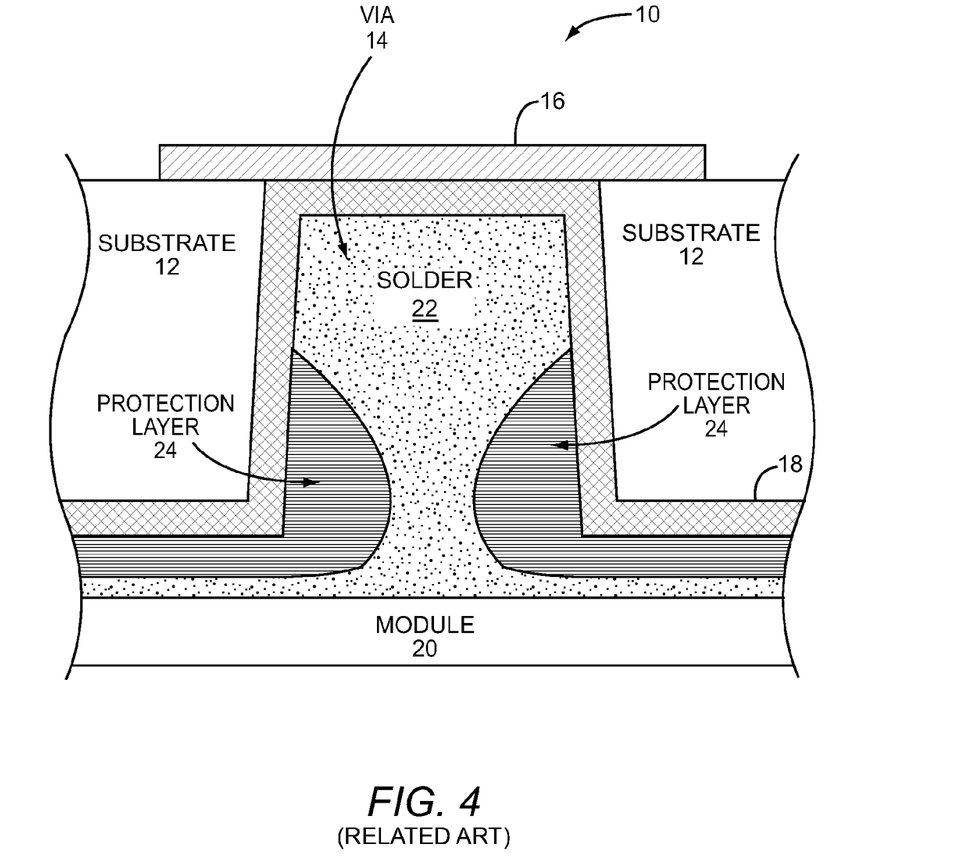
FIG. 4 is a cross-section of the substrate of FIG. 1, wherein solder substantially fills the via even though a protection layer is provided.

One effort to prevent the solder 22 from entering the via 14 during the soldering process is to deposit a protection layer 24 over a portion of the back side metallization structure 18, as illustrated in FIG. 4. Ideally, the protection layer 24 would form a continuous layer over the portion of the back side metallization structure 18 that resides along the side walls of the via 14 and the portion of the via 14 that resides along the bottom of the front side metallization structure 16. Unfortunately, available deposition processes are unable to form a uniform protection layer 24 over the back side metallization structure 18 within the via 14. As illustrated, the top portion of the via 14 may have little or no protection layer 24 deposited thereon. Further, the protection layer 24 will often fail to seal the opening into the via 14, and as such, the solder 22 can still flow into the via 14 and come into contact with the back side metallization structure 18. As a result, the solder 22 can still diffuse to, into, or through the front side metallization structure 16. An exemplary metal for the protection layer 24 is titanium; however, other materials may be used in an effort to prevent the solder 22 from wicking and entering the via 14.

Figure 5:
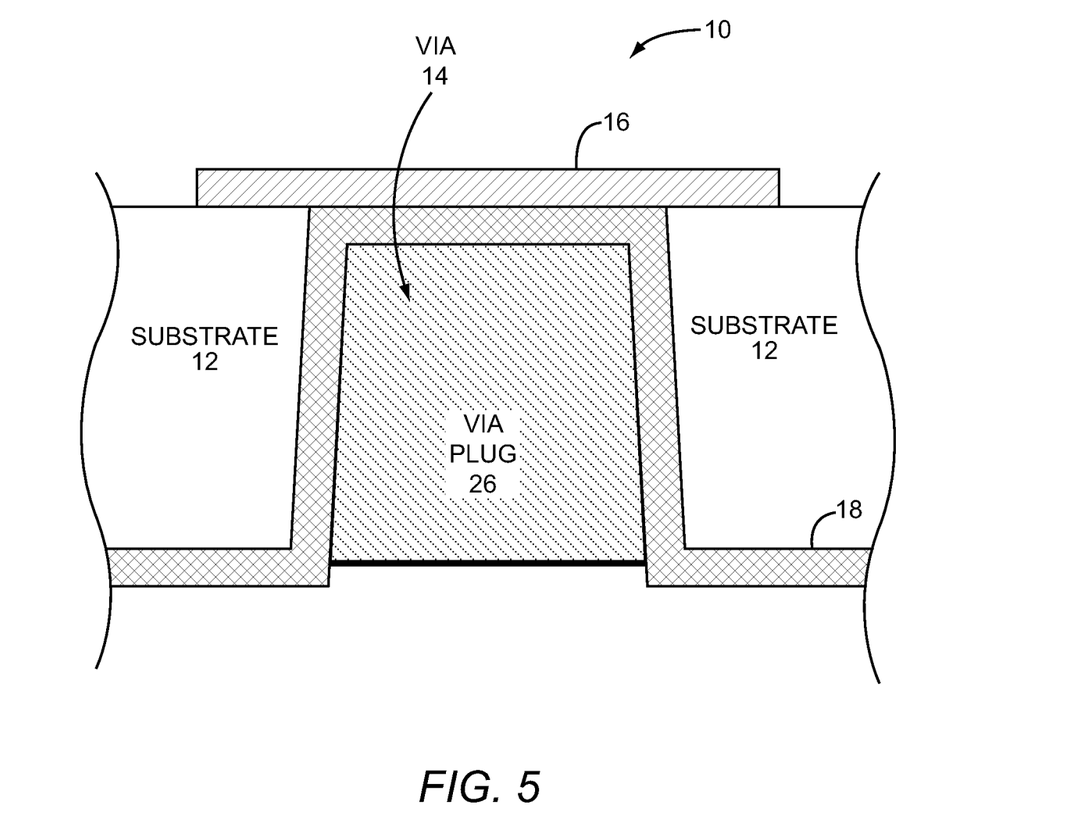
FIG. 5 is a cross-section of the substrate of FIG. 1, wherein a via plug according to the present disclosure is provided in the via according to a first embodiment.
Figure 6:
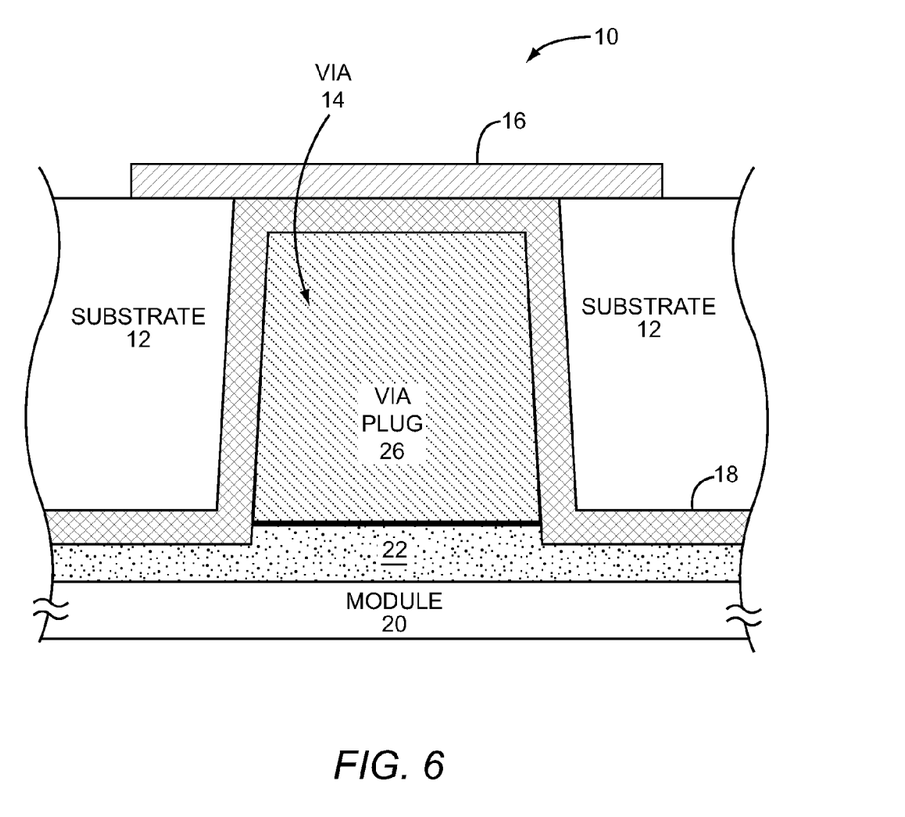
FIG. 6 is a cross-section of the substrate of FIG. 5 connected to a module according to a first embodiment.

In one embodiment of the present disclosure, a via plug 26 is formed in the via 14 prior to the via 14 being exposed to a soldering process. The via plug 26 is formed of a material that can withstand soldering and normal operation temperatures, while preventing solder from wicking and entering the via 14, as illustrated in FIG. 5. As depicted in FIG. 6, the substrate 12 can be effectively soldered to the module 20, wherein the solder 22 is used to electrically and mechanically couple the back side metallization structure 18 of the module 20. While the solder 22 can wick along portions of the back side metallization structure 18 that are not within the via 14, the via plug 26 prevents the solder 22 from wicking to any of the portions of the back side metallization structure 18 that line the inside of the via 14. During the high temperatures of the soldering process or during normal operation, the via plug 26 provides a sufficient barrier to prevent the solder 22 from diffusing to the front side metallization structure 16.

The via plug 26 may be formed from a polymer, and in certain embodiments, a high temperature polymer that is effectively injected into the vias 14 and cured. Exemplary polymers include polyimides, photoresist materials such as polymethylglutarimide (PMGI) resists, epoxies, thermoplastics, thermosets, and the like. Typically, the polymer is a solvent-free material.

For an example, assume the via plug 26 is formed from a polyimide, such as HD-4000 or PI-2600 series polyimide, made by HD Microsystems of 250 Cheesequake Road, Parlin, N.J. 08859, or the like. To form the via plugs 26 in the vias 14, the polyimide is applied along the back side metallization structure 18 in liquid form and under a vacuum. The substrate 12 is then spun to help spread the liquid-form polyimide along the back side metallization structure 18 while the vacuum urges the polyimide to flow into the vias 14. A curing process ensues, wherein the polyimide is heated to a temperature of around about 200-300 Celsius, wherein the polyimide solidifies and is cured to form a material that resists wicking of the solder 22.

At this point, the cured polyimide not only extends into or fills the vias 14, but also provides a film over the back side metallization structure 18. To remove the residue from the back side metallization structure 18, the residue is exposed to an oxygen plasma of an ashing process. The ashing process effectively removes the residue from the surface of the back side metallization structure 18, yet leaves the via plugs 26 in place within the vias 14. Notably, the via plugs 26 need not completely fill the vias 14. The via plugs 26 need only fill the vias 14 sufficiently to prevent a large enough quantity of solder 22 from entering the via 14 and degrading overall performance more than a set amount. For example, the via plug 26 may be completely or substantially surrounded by the solder 22; however, the via plug 26 will effectively displace a majority of the solder 22 that would normally fill the via 14.

Figure 7:
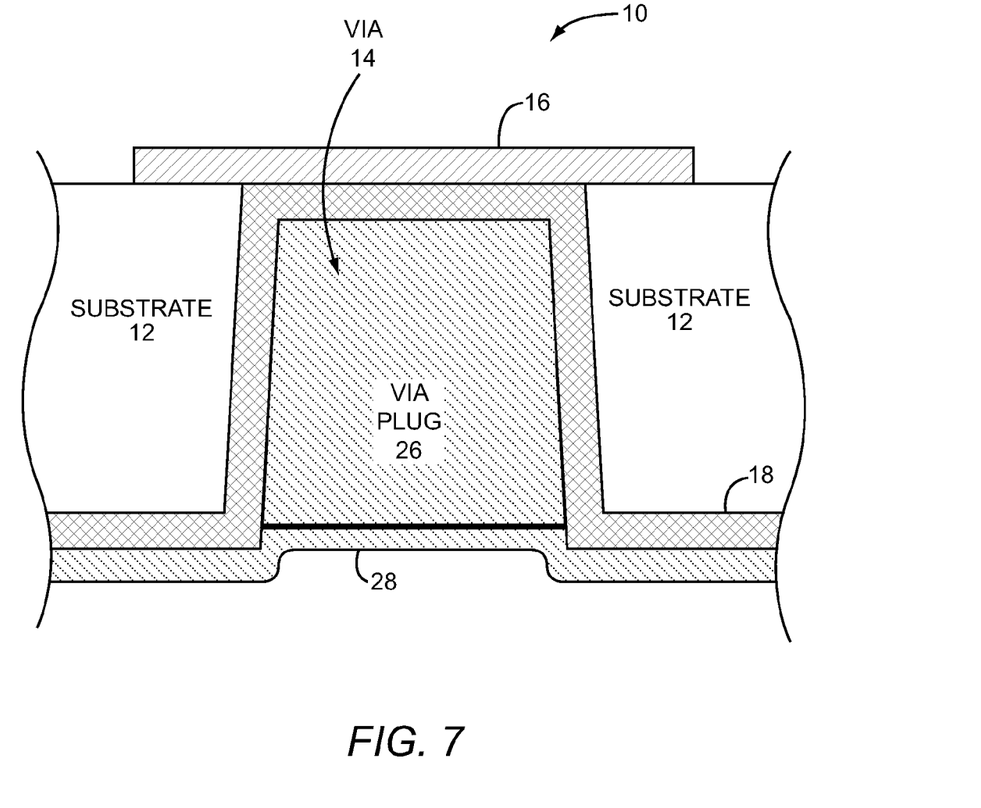
FIG. 7 is a cross-section of the substrate of FIG. 1, wherein a via plug according to the present disclosure is provided in the via according to a second embodiment.

In another embodiment, an external barrier layer 28 may be applied over the exposed portion of the via plug 26 and portions of the back side metallization layer 18 that surround the via plug 26, as illustrated in FIG. 7. With the addition of the external barrier layer 28, the combination of the external barrier layer 28 and the portion of the back side metallization layer 18 that extends into the via 14 may substantially enclose, and perhaps actually hermetically seal, the via plug 26. Accordingly, the forces associated with the subsequent soldering process are unlikely to damage the via plug 26 or actually force the via plug 26 out of the via 14. Application of the external barrier layer 28 also helps prevent cracking from occurring along layer the portion of the back side metallization layer 18 that extends into the via 14. Minimizing these cracks acts as a further barrier to the solder 22 diffusing to the front side metallization structure 16.

The external barrier layer 28 may be deposited using sputtering or evaporated deposition techniques, plating, or the like. In select embodiments, the external barrier layer may include titanium (Ti), chrome, nickel chromium (NiCr), or titanium tungsten (TiW). Exemplary, yet non-limiting ranges for thicknesses of the external barrier layer 28 include from about 1500 Angstroms to about 10,000 Angstroms and from about 4000 Angstroms to about 8,000 Angstroms.

Figure 8:
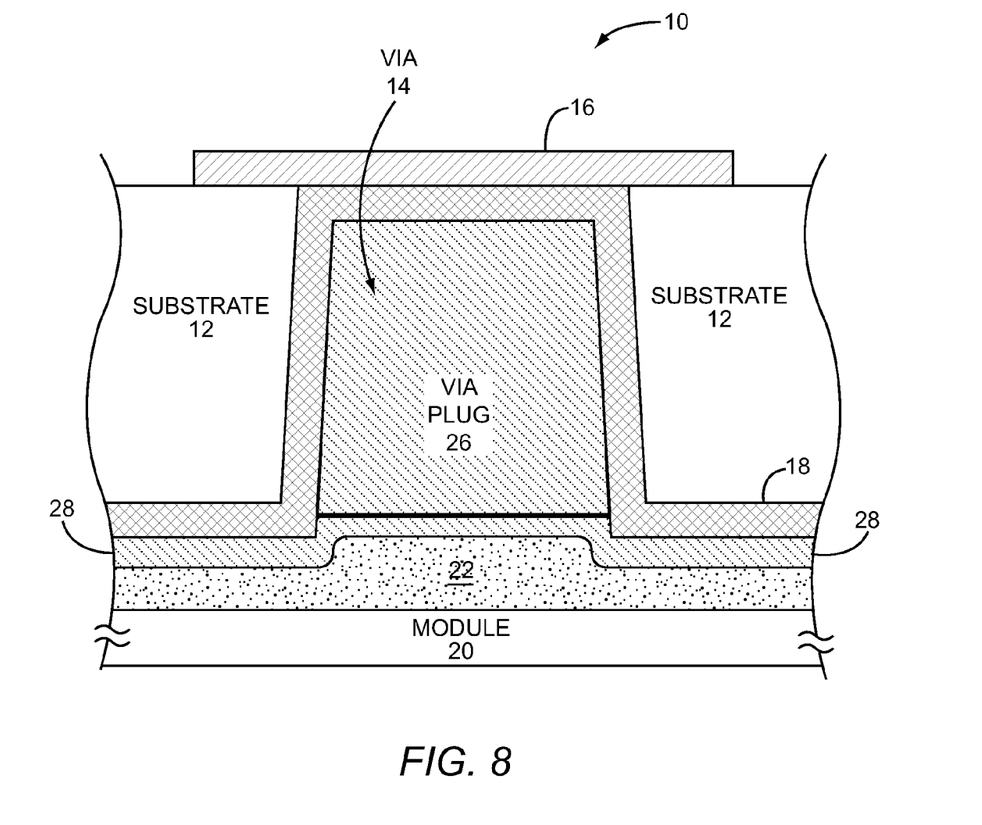
FIG. 8 is a cross-section of the substrate of FIG. 7 connected to a module according to a second embodiment.

As depicted in FIG. 8, the substrate 12 can be effectively soldered to the module 20, wherein the solder 22 is used to electrically and mechanically couple the external barrier layer 28, which is directly or indirectly coupled to the back side metallization structure 18 of the module 20. As those skilled in the art will appreciate, various intermediate layers may be provided as desired between any of the illustrated layers.

Figure 9:
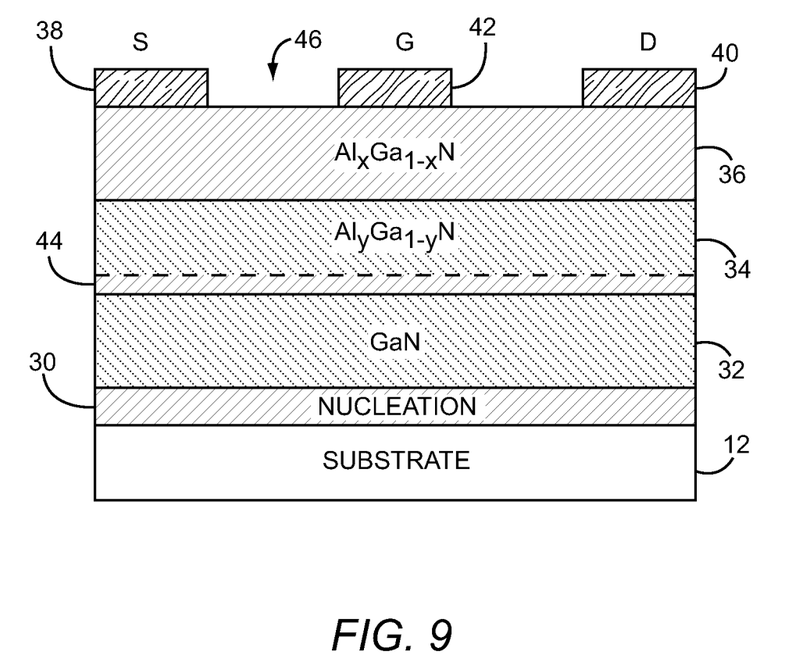
FIG. 9 is a cross-section of a high electron mobility transistor (HEMT) according to one embodiment of the present disclosure.
Figure 10:
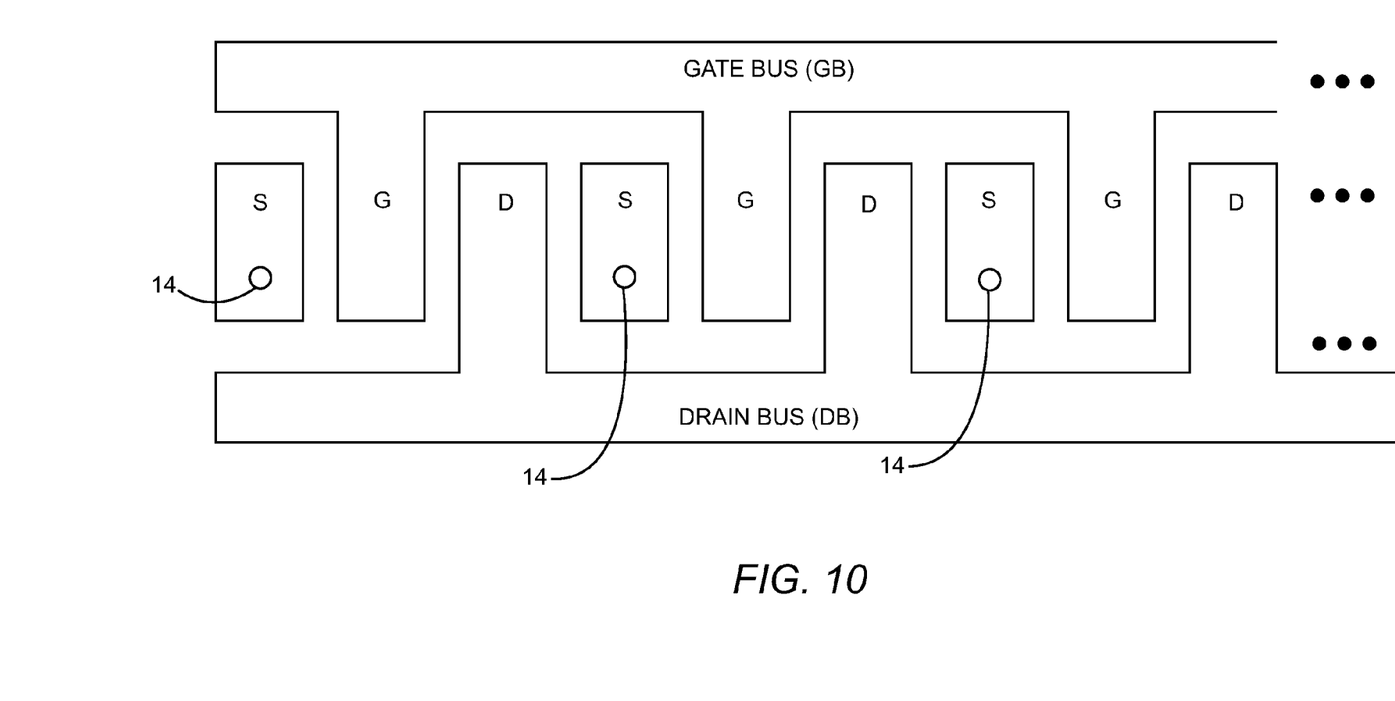
FIG. 10 is a top view of the source, gate, and drain structures of a HEMT structure.

FIG. 9 shows one embodiment of a HEMT 44 constructed in accordance with the one embodiment on a substrate 12. As noted above, the substrate 12 can be made of different materials, such as silicon carbide. Silicon carbide has a close crystalline lattice match to Group III nitrides and generally supports Group III nitride films of higher quality. Silicon carbide also has a very high thermal conductivity so that the total output power of Group III nitride devices on silicon carbide is not limited by the thermal dissipation of the substrate. Also, the availability of silicon carbide substrates provides the capacity for device isolation and reduced parasitic capacitance that make commercial devices possible. Silicon carbide substrates are available from Cree Research, Inc., of Durham, N.C. and methods for producing them are set forth in the scientific literature as well as in a U.S. Pat. Nos. Re. 34,861; 4,946,547; and 5,200,022.

The HEMT 44 can be fabricated using many different material systems, such as Group III nitride based material systems. Group III nitrides refer to those semiconductor compounds formed between nitrogen and the elements in Group III of the periodic table, usually aluminum (Al), gallium (Ga), and indium (In). The term also refers to ternary and tertiary compounds such as AlGaN and AlInGaN. The spontaneous and piezoelectric polarization in wurtzite Group III-nitrides are found to be approximately 10 times larger than in conventional Group III-V and II-VI semiconductor compounds.

A nucleation layer 30 can be included on the substrate 12 to reduce the lattice mismatch between the substrate 12 and the next layer in the HEMT 46. The nucleation layer 30 may be approximately 1000 angstroms (Å) thick, although other thicknesses can be used. It can be made of different semiconductor materials with one suitable material being $Al_zGa_{1-z}N$ ($0 \leq z \leq 1$), including AlN ($Al_zGa_{1-z}N$ for z=1).

A GaN layer 32 is included on the nucleation layer 30, opposite the substrate 12. The GaN layer 32 may be in the range of approximately 0-5 microns thick, although other thicknesses can be used. In one embodiment, the GaN layer 32 is 2 microns thick. In another embodiment, the GaN layer 32 can be made of $Al_wGa_{1-w}N$ ($0 \leq w \leq 1$).

An $Al_yGa_{1-y}N$ layer 34 is included on the GaN layer 32, opposite the nucleation layer 30. The $Al_yGa_{1-y}N$ layer 34 may be less than 50 Å thick, but in different arrangements other thicknesses can be used, such as approximately 20 Å. The $Al_yGa_{1-y}N$ layer layer 34 can be formed of multiple monolayers of AlN, with each monolayer being in the range of approximately 5-20 Å thick. For example, a $Al_yGa_{1-y}N$ layer 34 formed of 4 monolayers that are 5 Å thick would be 20 Å thick.

An $Al_xGa_{1-x}N$ barrier layer 36 is included on the $Al_yGa_{1-y}N$ layer 34, opposite the GaN layer 32. The preferred composition of the $Al_xGa_{1-x}N$ barrier layer 36 is with $0 \leq x \leq 0.5$, although the composition can be varied, with x being between 0 and 1. The $Al_yGa_{1-y}N$ layer 36 may be in the range of approximately 100 to 1000 Å thick, although other thicknesses can be used. The thickness of the $Al_xGa_{1-x}N$ barrier layer 36 is dependent upon the layer's Al composition, the higher the Al composition the thinner the $Al_xGa_{1-x}N$ barrier layer 36 can be. In one embodiment of the HEMT 44, the $Al_xGa_{1-x}N$ barrier layer 36 is approximately 300 Å thick and has a composition of $Al_xGa_{1-x}N$ (x around about 0.33).

The HEMT 46 includes source, drain and gate contacts 38, 40, 42. The source and drain contacts 38, 40 can be made of different materials including but not limited to alloys of titanium, aluminum, or nickel. The gate contact 42 can also be made of different materials including but not limited to titanium, platinum, chromium, alloys of titanium and tungsten, or platinum silicide. A two-dimensional electron gas (2DEG) 44 forms at the junction between the $Al_yGa_{1-y}N$ layer 34 and the GaN layer 32.

With reference to FIG. 8, a top view of an exemplary HEMT 46 is provided wherein an interdigitated source, gate, and drain structure, which is typical for HEMTs and other field effect transistors, is illustrated. Notably, a gate bus (GB) and a drain bus (DB) connect with corresponding gate and drain fingers G and D, respectively. The gate and drain buses GB and DB and the associated gate and drain fingers G, D may be formed in the front side metallization structure 16. The gate and drain fingers G, D are adjacent one another, wherein a source finger S is provided between each drain and gate finger. These fingers represent the source, drain, and gate contacts 38, 40, and 42 of FIG. 7.

As is clear from the illustration, due to the nature of the gate and drain buses GB, DB, and their associated gate and drain fingers G, D, the source fingers S cannot be directly coupled to a source bus (not shown) on the same plane as the gate and drain buses GB, DB and the associated gate and drain fingers G, D. As such, vias 14 are used to connect the source fingers S to the underlying source bus (not shown). From the illustration, it is clear that the vias 14 associated with the source fingers S are in close proximity to both the drain and gate fingers D, G. If solder 22 fills the vias 14 and then during high temperature conditions diffuses through the front side metallization structure 16, the solder 22 could easily destroy or damage the source finger S as well as short the source finger S to one or both of the adjacent gate and drain fingers G, D. By using the via plugs 26 to fill the vias 14 prior to any back side soldering processes, any diffusion of solder 22 from the vias 14 to, into, or through the front side metallization structure 16 is significantly reduced, if not completely prevented.

The material used to form the via plugs 26, at least after any curing or hardening processes, should be able to maintain its structural integrity throughout any subsequent soldering or operating temperatures. For example, if the solder 22 has a melting point of 280 Celsius, the material may be selected such that the via plugs 26 maintain their structural integrity at temperatures of at least 300 to 380 Celsius or more. Different solders 22 may have different melting points, and as such, the material for the via plugs 26 should be selected accordingly.

An exemplary polyimide used for the via plugs 26 is HD-4000 made by HD Microsystems. Other polyimides include, but are not limited to, PI-2600 series polyimide made by HD Microsystems.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor device comprising:
   a wide bandgap semiconductor material comprising a first metallization structure on a first surface and at least one via extending from a second surface of the semiconductor material that is opposite the first surface to the first metallization structure; and
   a via plug provided within the at least one via, wherein the via plug is configured to prevent metal migration during operation of the semiconductor device.

2. The semiconductor device of claim 1 wherein the via plug is formed from a material that allows the via plug to retain its structural integrity up to at least 300 Celsius.

3. The semiconductor device of claim 1 wherein the via plug is formed from a material that allows the via plug to retain its structural integrity up to at least 380 Celsius.

4. The semiconductor device of claim 1 wherein the via plug is formed from a polymer.

5. The semiconductor device of claim 4 wherein the polymer is a cured polymer.

6. The semiconductor device of claim 5 wherein the cured polymer is a cured polyimide.

7. The semiconductor device of claim 5 wherein the via plug is formed from a material that allows the via plug to retain its structural integrity up to at least 300 Celsius.

8. The semiconductor device of claim 4 wherein the polymer is a solvent-free polymer.

9. The semiconductor device of claim 4 wherein the polymer is a solvent-free epoxy.

10. The semiconductor device of claim 4 wherein the polymer is a solvent-free thermoplastic.

11. The semiconductor device of claim 1 wherein the via plug is formed from a cured polyimide, which retains its structural integrity up to at least 300 Celsius.

12. The semiconductor device of claim 11 wherein the at least one via comprises at least one interior wall and further comprising a second metallization structure lining at least a portion of the at least one interior wall and a portion of the second surface of the semiconductor material.

13. The semiconductor device of claim 1 wherein the at least one via comprises at least one interior wall and further comprising a second metallization structure lining at least a portion of the at least one interior wall and a portion of the second surface of the semiconductor material.

14. The semiconductor device of claim 13 wherein the via plug has an exposed portion and further comprising an external barrier layer that covers the exposed portion of the via plug and at least a portion of the second metallization structure that resides over the portion of the second surface of the semiconductor material.

15. The semiconductor device of claim 14 wherein the via plug is substantially enclosed by the external barrier layer and a portion of the second metallization structure.

16. The semiconductor device of claim 14 wherein the external barrier layer comprises at least one of a group consisting of titanium, chrome, nickel chromium, and titanium tungsten.

17. The semiconductor device of claim 1 wherein the semiconductor device is formed on the semiconductor material.

18. The semiconductor device of claim 1 wherein the via plug is formed from a material that allows the via plug to retain its structural integrity at temperatures over about 380 Celsius.

* * * * *